United States Patent
Osada et al.

(10) Patent No.: US 10,102,062 B2
(45) Date of Patent: Oct. 16, 2018

(54) SEMICONDUCTOR STORAGE DEVICE

(71) Applicant: TOSHIBA MEMORY CORPORATION, Minato-ku, Tokyo (JP)

(72) Inventors: Yoshiaki Osada, Kawasaki Kanagawa (JP); Katsuhiko Hoya, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/692,971

(22) Filed: Aug. 31, 2017

(65) Prior Publication Data

US 2017/0364407 A1 Dec. 21, 2017

Related U.S. Application Data

(63) Continuation of application No. PCT/JP2015/076374, filed on Sep. 10, 2015.
(60) Provisional application No. 62/130,490, filed on Mar. 9, 2015.

(51) Int. Cl.
*G11C 11/00* (2006.01)
*G06F 11/10* (2006.01)
(Continued)

(52) U.S. Cl.
CPC ........ *G06F 11/1068* (2013.01); *G06F 11/106* (2013.01); *G06F 11/3037* (2013.01); *G11C 17/16* (2013.01); *G11C 17/18* (2013.01); *G11C 29/42* (2013.01); *G11C 29/44* (2013.01); *G11C 29/4401* (2013.01); *G11C 29/52* (2013.01); *G11C 29/785* (2013.01); *G06F 2201/81* (2013.01); *G06F 2201/88* (2013.01);
(Continued)

(58) Field of Classification Search
CPC ............... G06F 11/1068; G06F 11/106; G06F 11/3037; G11C 17/16
USPC ........... 365/148, 46, 94, 100, 129, 158, 163; 257/2–5, 9, 310, E21.35; 438/95, 96, 438/135, 166, 240, 365, 482, 486, 597, 438/785
See application file for complete search history.

(56) References Cited

U.S. PATENT DOCUMENTS

| 6,240,033 | B1 | 5/2001 | Yang et al. |
| 6,349,390 | B1 | 2/2002 | Dell et al. |
| 2002/0080650 | A1 | 6/2002 | Katayama et al. |

(Continued)

FOREIGN PATENT DOCUMENTS

| JP | 04101254 A | 4/1992 |
| JP | 10011284 A | 1/1998 |

(Continued)

OTHER PUBLICATIONS

International Search Report (ISR) and Written Opinion dated Nov. 17, 2015 issued in International Application No. PCT/JP2015/076374.

*Primary Examiner* — Harry W Byrne
(74) *Attorney, Agent, or Firm* — Holtz Holtz & Volek PC

(57) ABSTRACT

According to one embodiment, a memory system includes: a first memory cell area where a first memory cell is provided; a second memory cell area where a second memory cell is provided; an ECC circuit which corrects an error of data stored by the first memory cell; and a control circuit which replaces the first memory cell with the second memory cell if the number of times an error is successfully corrected in the first memory cell reaches a first value.

20 Claims, 7 Drawing Sheets

(51) Int. Cl.
*G06F 11/30* (2006.01)
*G11C 17/16* (2006.01)
*G11C 17/18* (2006.01)
*G11C 29/42* (2006.01)
*G11C 29/44* (2006.01)
*G11C 29/00* (2006.01)
*G11C 29/52* (2006.01)
*G11C 29/04* (2006.01)

(52) U.S. Cl.
CPC ............... *G11C 2029/0409* (2013.01); *G11C 2029/0411* (2013.01); *G11C 2029/4402* (2013.01)

(56) References Cited

U.S. PATENT DOCUMENTS

| | | |
|---|---|---|
| 2003/0033567 A1 | 2/2003 | Tamura et al. |
| 2004/0057316 A1* | 3/2004 | Kozakai ............ G06F 11/1068 365/222 |
| 2005/0007860 A1* | 1/2005 | Kozakai ............ G06F 11/1068 365/230.03 |
| 2006/0114726 A1* | 6/2006 | Kozakai ............ G06F 11/1068 365/185.29 |
| 2007/0206418 A1* | 9/2007 | Kozakai ............ G06F 11/1068 365/185.09 |
| 2008/0158963 A1* | 7/2008 | Kozakai ............ G06F 11/1068 365/185.09 |
| 2011/0283054 A1* | 11/2011 | Kozakai ............ G06F 11/1068 711/103 |
| 2013/0138870 A1* | 5/2013 | Yoon ................ G11C 11/5621 711/103 |
| 2013/0326267 A1 | 12/2013 | Moon et al. |
| 2014/0053041 A1* | 2/2014 | Sakaue ............ H03M 13/2909 714/758 |

FOREIGN PATENT DOCUMENTS

| | | |
|---|---|---|
| JP | 2008198020 A | 8/2008 |
| WO | 9808166 A1 | 2/1998 |

* cited by examiner

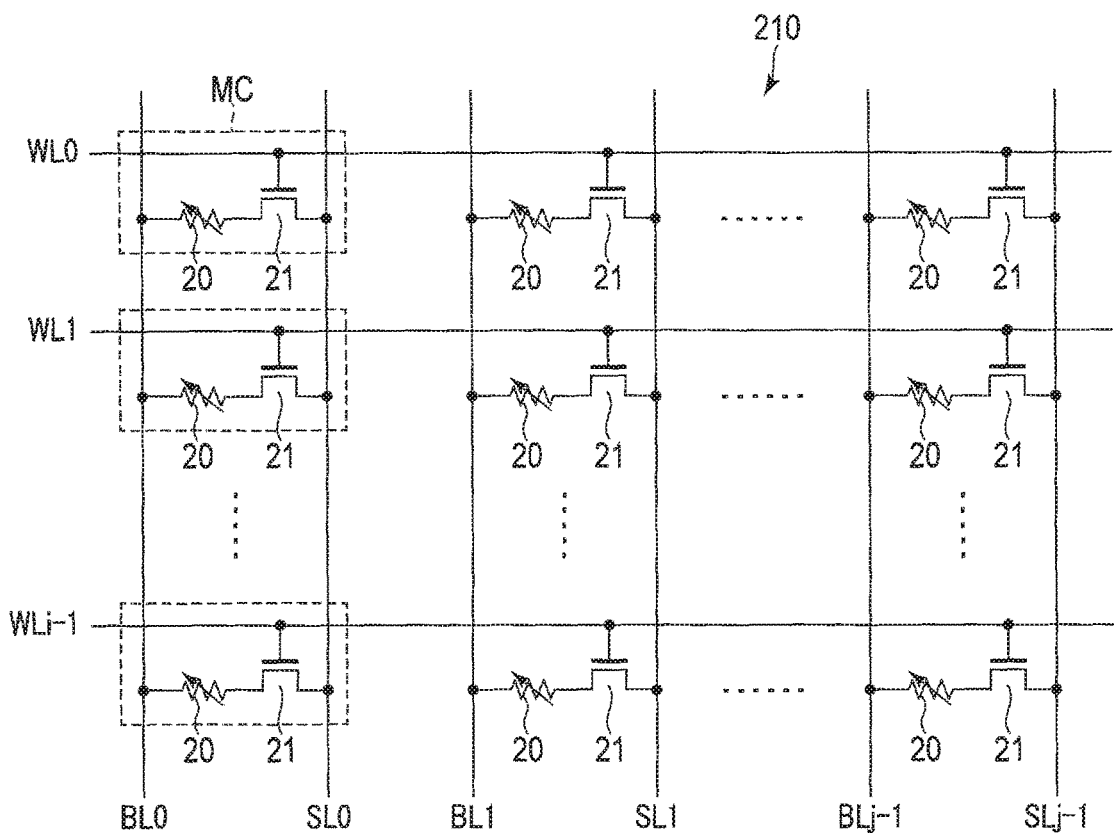
F I G. 2

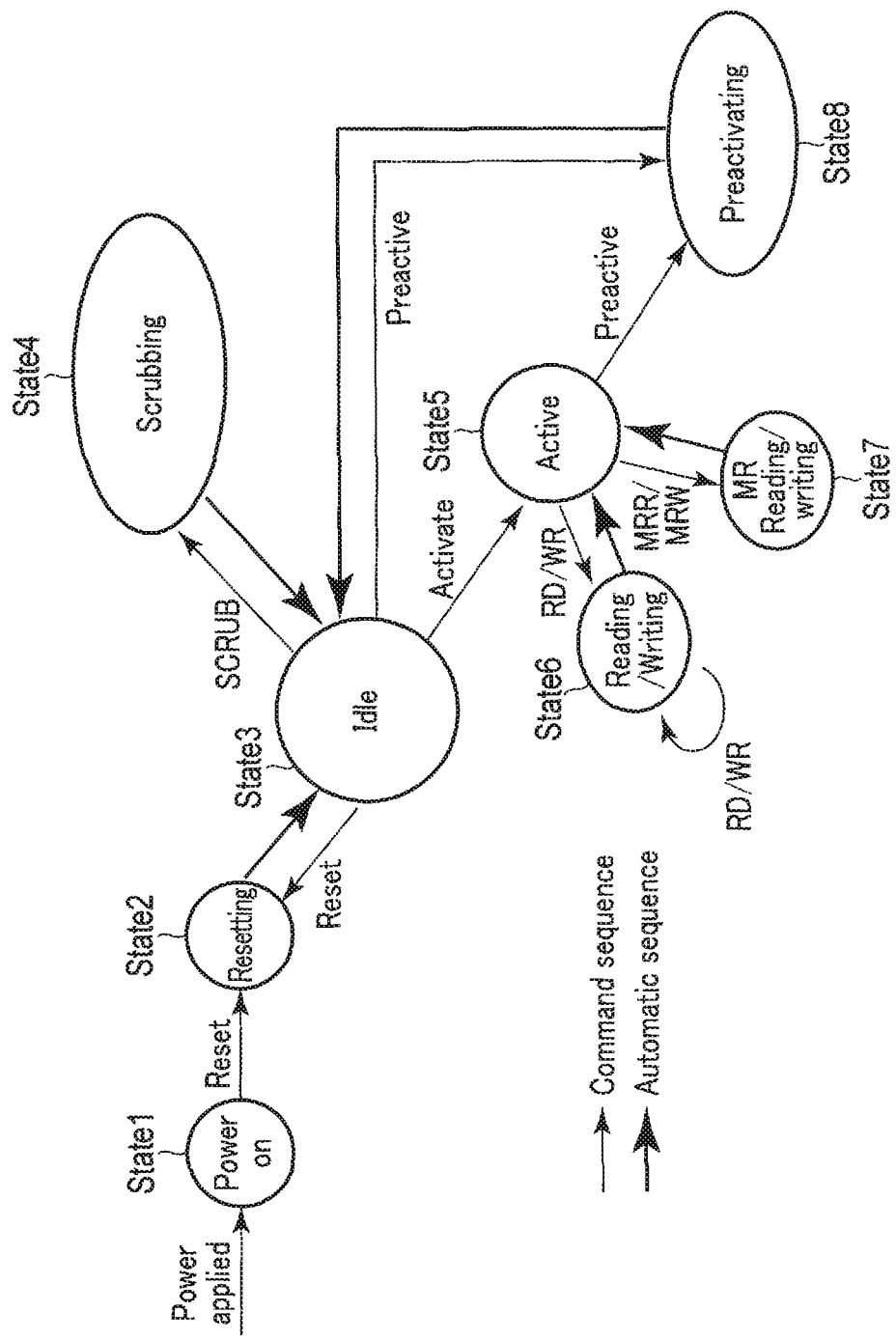
F I G. 4

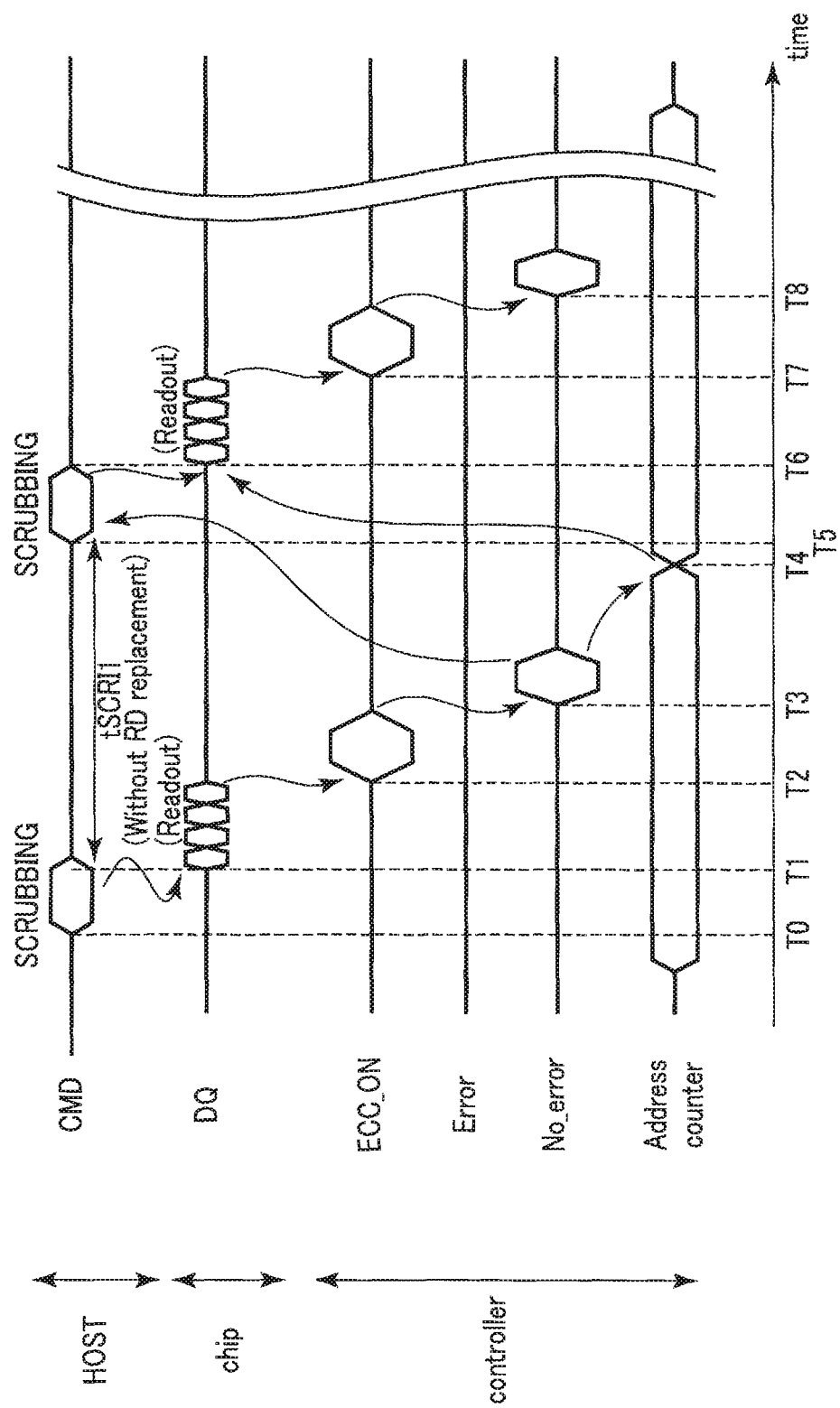
F I G. 6

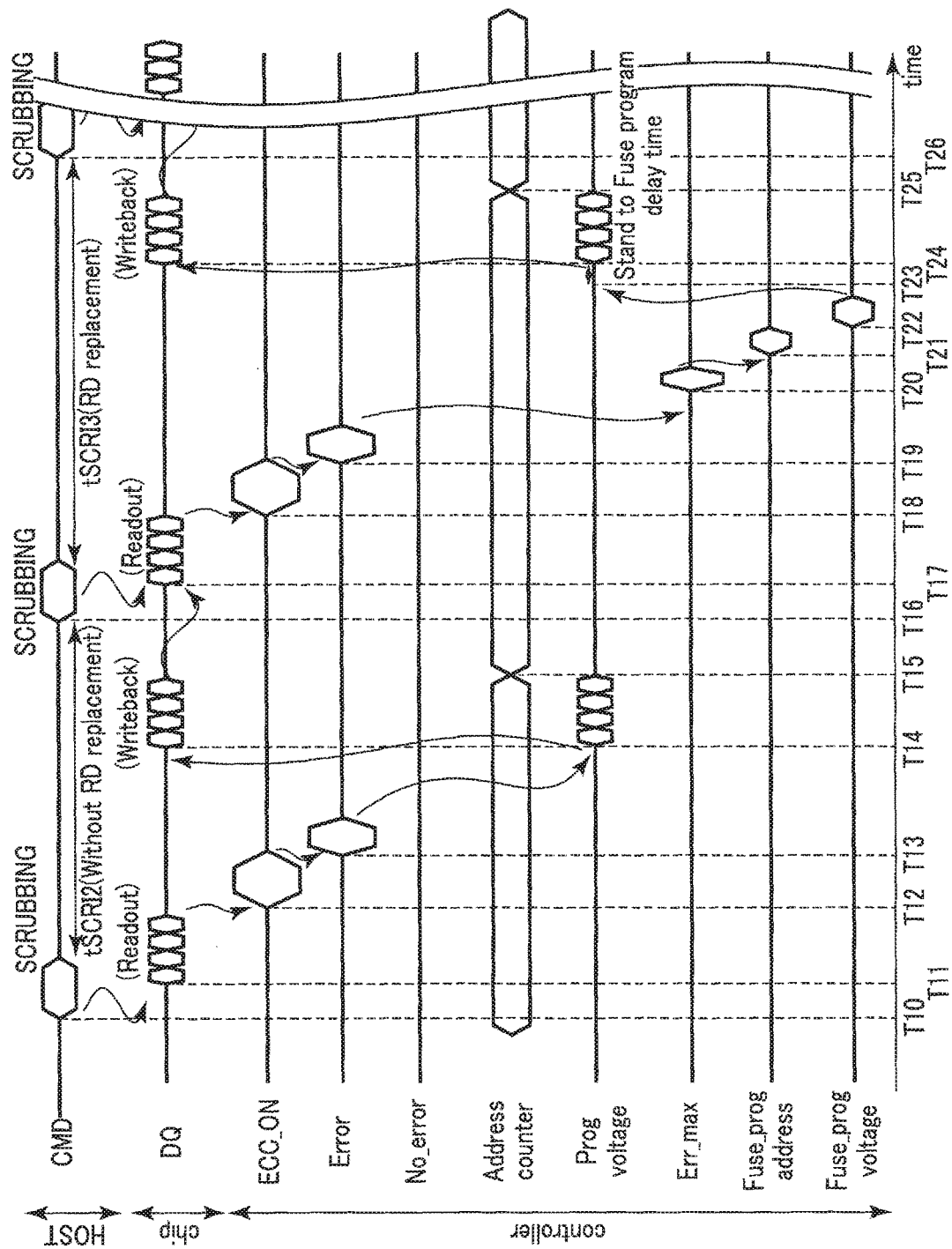
F I G. 7

SEMICONDUCTOR STORAGE DEVICE

CROSS-REFERENCE TO RELATED APPLICATIONS

This application is a Continuation. Application of PCT Application No. PCT/JP2015/076374, filed Sep. 10, 2015 and based upon and claiming the benefit of priority from prior U.S. Provisional Application No. 62/130,490, filed Mar. 9, 2015, the entire contents of all of which are incorporated herein by reference.

FIELD

The present embodiment relates to a semiconductor storage device.

BACKGROUND

A magnetoresistive random access memory (MRAM) is a memory device wherein a memory cell for storing information employs a magnetic element having a magnetoresistive effect. The MRAM receives attention as a next-generation memory device featuring a high-speed operation, a large storage capacity, and non-volatility. In the meantime, researches and developments are being made to replace a dynamic random access memory (DRAM) and a static random access memory (SRAM) with the MRAMs. In order to lower the development cost and enable easy replacement, the MRAM should desirably operate on the same specifications as the DRAM and SRAM.

BRIEF DESCRIPTION OF THE DRAWINGS

FIG. 2 is a circuit diagram showing an exemplary configuration of a memory cell array of the memory system of the embodiment.

FIG. 4 is a state diagram illustrating the memory system of the embodiment.

FIG. 6 is a waveform chart illustrating the scrub operation of the memory system of the embodiment.

FIG. 7 is a waveform chart illustrating the scrub operation of the memory system of the embodiment.

DETAILED DESCRIPTION

In general, according to one embodiment, a memory system includes:

a first memory cell area where a first memory cell is provided; a second memory cell area where a second memory cell is provided;

an ECC circuit which corrects an error of data stored by the first memory cell; and a control circuit which replaces the first memory cell with the second memory cell if the number of times an error in the first memory cell is successfully corrected reaches a first value.

A description will now be given of embodiments. In the description below, structural elements having substantially the same functions and configurations will be denoted by the same reference symbols, and a repetitive description will be given only where necessary. Each of the embodiments described below merely shows an exemplary apparatus and method that implement the technical ideas of the embodiments. The technical ideas of the embodiments are not limited to the element materials, shapes, structures, arrangements etc. described below. The technical ideas of the embodiments may be varied within the range defined in the claims.

Each of the function blocks can be implemented in the form of hardware, computer software or a combination of them. In order to clarify what are specifically meant by the function blocks, the blocks will be explained below in terms of their function. Whether the functions are implemented as hardware or software is a matter of specific implementation or depends upon design restrictions imposed on the entire system. Those skilled in the art can implement the functions in various ways for each of the embodiments, and how to implement the functions is within the range of the embodiments.

Embodiment

<1> Configuration

The present embodiment will be described, referring to the case where an MRAM is applied to a memory cell array.

<1-1> Configuration of Memory System

Figure 1:
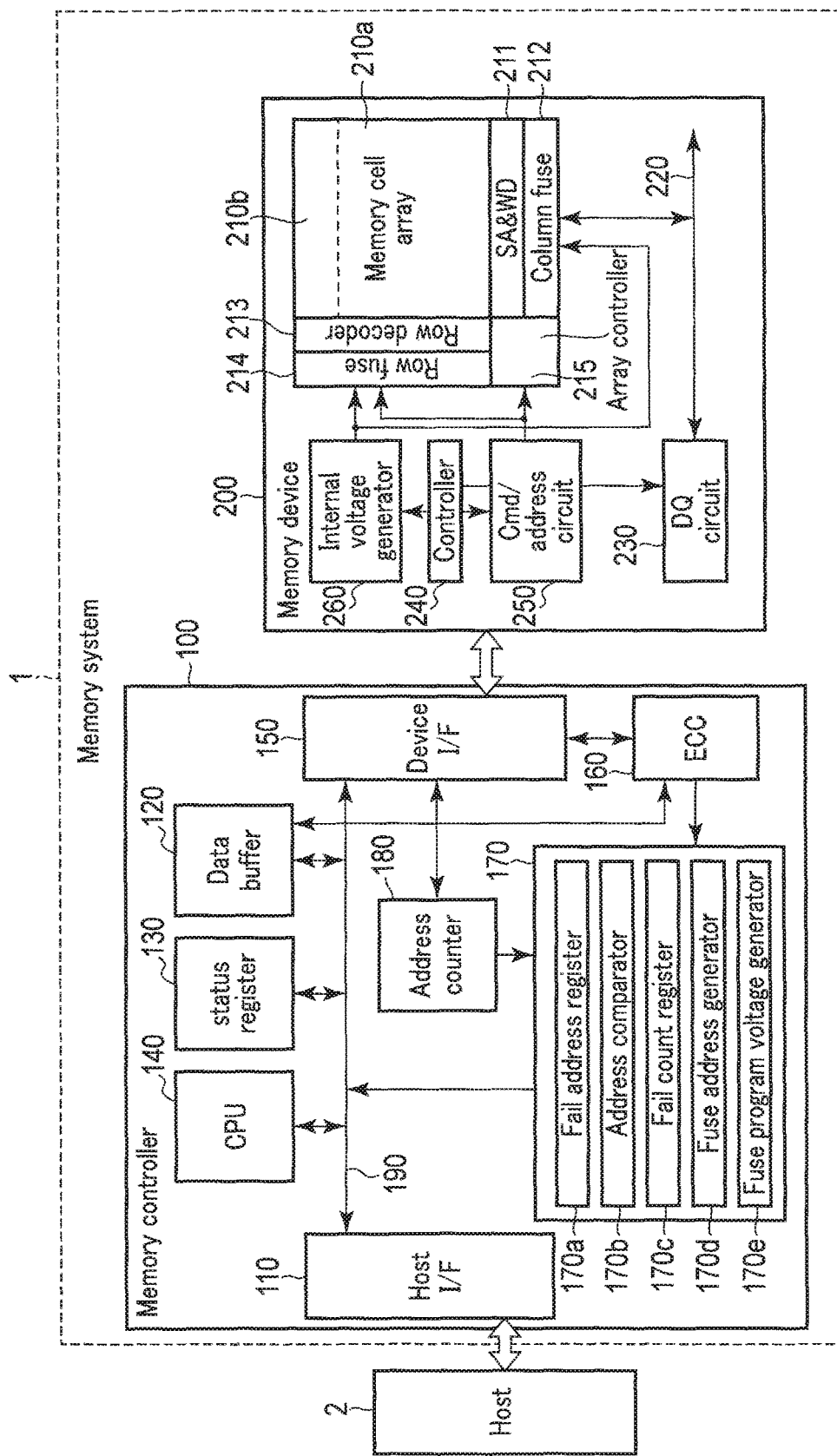
FIG. 1 is a block diagram showing an exemplary configuration of a memory system according to an embodiment.

A schematic description will be given with reference to FIG. 1 of the basic configuration of a memory system according to the embodiment. The memory system 1 comprises a memory controller 100 and a memory device 200.

<1-2> Configuration of Memory Controller

The memory controller 100 of the embodiment receives commands from a host 2. In accordance with the commands, the memory controller 100 reads data from the memory device 200 and writes data in the memory device 200.

The memory controller 100 is provided with a host interface (host I/F) 110, a data buffer 120, a status register 130, a central processing unit (CPU) 140, a device interface (IF) 150, an error correcting code (ECC) circuit 160, a fuse controller 170, and an address counter 180.

The host interface 110 is connected to the host (external apparatus) 2, such as a personal computer, and is further connected to the bus 190 of the memory controller 100. Through the host interface 110, data are transmitted and received between the host 2 and the memory system 1.

The data buffer 120 is connected to the host interface 110 and further to the bus 190. The data buffer 120 receives, by way of the host interface 110, data transmitted from the host 2 to the memory system 1, and temporarily stores the data. Also, the data buffer 120 temporarily stores data which are to be transmitted from the memory system 1 to the host 2 by way of the host interface 110. The data buffer 120 may be either a volatile memory or a nonvolatile memory.

The CPU 140 controls the overall operations of the memory system 1. The CPU 140 performs predetermined processing for the memory device 200 in accordance with commands received from the host 2, for example.

The status register 130 is, for example, a volatile memory, and stores setting information, commands executed by the CPU 140, and status signals. The status register 130 may be either a volatile memory or a nonvolatile memory.

The device interface 150 interfaces the memory controller 100 and the memory device 200 and enables various kinds of signals to be transmitted and received between them. The device interface 150 is connected to the ECC circuit 160, the address counter 180 and the bus 190.

The ECC circuit 160 receives write data received from the host 2, by way of the data buffer 120. The ECC circuit 160 adds an error correcting code to the write data. The ECC circuit 160 supplies the write data, including the error correcting code added thereto, to either the data buffer 120 or the device interface 150.

The ECC circuit 160 receives data supplied from the memory device 200, by way of the device interface 150. The data are data stored in a memory cell group of the memory cell array 210. The memory cell group is a set of memory cells MC and corresponds to a read unit at the time of read operations. The ECC circuit 160 determines whether the data received from the memory device 200 contains an error. If the received data contains an error, the ECC circuit performs error correction for the received data, using the error correcting code. The ECC circuit 160 supplies the data subjected to the error correction to the data buffer 120, the device interface 150, etc. If it is determined that data read from the memory device 200 contains an error, the ECC circuit 160 supplies an error notification signal "Error" to the fuse controller 170. If it is determined that data read from the memory device 200 does not contain an error, the ECC circuit 160 supplies a notification signal "No_Error" to the host 2.

The fuse controller 170 generates redundancy address information (by which the memory cells used for storing the data are replaced with redundancy cells) and a fuse program voltage generating signal in accordance with the number of times an error occurs (in the present embodiment, the number of times is equal to the number of times an error is successfully corrected by the ECC circuit 160).

The fuse controller 170 comprises a fail address register 170a, an address comparator 170b, a fail count register 170c, a fuse address generator 170d and a fuse program voltage generator 170e.

The fail address generator 170a stores, as fail address information, address information representing the memory cell array 210 in which an error is detected by the ECC circuit 160. For the sake of simplicity, the address of the memory cell array 210 may be referred to simply as the "address" in the description of the present embodiment. The "address" is information representing where the memory cell MC of the memory cell array 210 or the memory cell group is located. The fail address register 170a can store a plurality of pieces of defective address information. The fail address register 170a may be either a volatile memory or a nonvolatile memory.

The address comparator 170b compares an address which the ECC circuit 160 determines as containing an error with the address stored in the fail address register 170a. To be more specific, the address comparator 170b receives an address representing the location of an error from the address counter 180, if it receives error notification signal "Error" from the ECC circuit 160. Subsequently, the address comparator 170b determines whether the received address information is stored in the fail address register 170a.

The fail count register 170c stores data representing the number of times an error occurs at the defective address stored in the fail address register 170a (the number of times is equal to the number of times the error is successfully corrected). Upon detection of an error by the ECC circuit 160, the fail count register 170c increases the number of times an error is repeated at the address corresponding to the error. When the number of times an corrected) is increased and reaches a threshold stored in the fail counter register 170c, the fail count register 170c transmits signal "Err_max" to the fuse address generator 170d and the fuse program voltage generator 170e. The fail count register 170c may be either a volatile memory or a nonvolatile memory.

If the number of times the error occurs at the defective address (i.e., the number of times the error is successfully corrected) reaches the threshold, the fuse address generator 170d generates redundancy address information by which the memory cell MC corresponding to the defective address is replaced with a redundancy cell. More specifically, upon reception of signal "Err_max" from the fail count register 170c, the fuse address register 170d generates a fuse address (redundancy address information) of a column fuse 212 and/or a row fuse 214 so that the corresponding address is replaced with the address of a redundancy cell. The fuse address generator 170d may be configured to generate a fuse address or addresses in such a manner that a memory cell group is replaced with a redundancy cell group or a single memory cell is replaced with a redundancy cell. In connection with the present embodiment, reference was made to the case where the memory system 1 replaces a memory cell with a redundancy cell.

If it is determined that the number of times the error occurs at the defective address has reached the threshold, the fuse program voltage generator 170e generates a fuse program voltage generating signal. Upon receipt of the fuse program voltage generating signal, the internal voltage generator 260 of the memory device 200 generates a voltage on which a fuse programming operation is performed for the column fuse 212 and/or the row fuse 214.

The fuse controller 170 may comprises a controller which controls the fail address register 170a, the address comparator 170b, the fail count register 170c, the fuse address generator 170d and the fuse program voltage generator 170e.

The address counter 180 stores address information used for the scrub operation mentioned later.

<1-3> Configuration of Memory Device

The memory device 200 of the embodiment comprises a memory cell array (which may be referred to simply as a "cell array") 210, a sense amplifier/write driver 211, a column fuse 212, a row decoder 213, a row fuse 214, an array controller 215, a DQ circuit 230, a controller 240, a command/address circuit 250, and an interval voltage generator 260.

The memory cell array 210 is an MRAM comprising a plurality of memory cells arranged in a two-dimensional matrix pattern. The memory cell array 210 comprises an ordinary cell array (which may be referred to as an ordinary memory area as well) 210a, and a redundancy cell array (which may be referred to as a redundancy memory area as well) 210b. Each of the ordinary cell array 210a and the redundancy cell array 210b includes a plurality of memory cells MC. The ordinary cell array 210a and the redundancy cell array 210b are the same in terms of the structure of the memory cells MC. The ordinary cell array 210a is a basic memory area used for a normal read operation or a normal write operation. The redundancy cell array 210b is a memory area for remedying a defect of the ordinary cell array 210a. For example, let us assume that the ordinary cell array 210a has an inherent defect and this defect is found in the test operation of the memory system 1 performed before shipping. In this case, the memory cell MC where an error occurs is replaced with a memory cell of the redundancy cell array 210b. By this replacement, the inherently defective memory cell MC is prevented from being used. As will be described later, the replacement of a defective memory cell may be performed in a scrub operation performed after the shipping of the memory system 1. Where redundancy information corresponding to an address to be accessed is stored in the column fuse 212 and/or row fuse 214, the redundancy cell array 210b is accessed. Where redundancy information corresponding to the address to be accessed is not stored in the column fuse 212 or row fuse 214, the ordinary cell array 210a is accessed. In the specification, a memory cell MC provided in the ordinary cell array 210a is referred to as an ordinary cell as well, and a memory cell provided in the redundancy cell array 210b is referred to as a redundancy cell array as well. The specific configuration of the memory cell array 210 will be described later.

The sense amplifier/write driver (which is also referred to as a bit line controller) 211 is arranged to extend in the bit line direction of the memory cell array 210. The sense amplifier/write driver 211 includes a sense amplifier and a write driver. The sense amplifier is connected to bit lines BL, and reads data from a memory cell MC when it detects a current flowing through the memory cell MC connected to a selected word line WL. The write driver is connected to the bit lines BL, and writes data in the memory cell MC when it supplies a current to the memory cell MC connected to a selected word line WL. The sense/write driver 211 controls the bit line BL and the source line SL based on control signals supplied from the array controller 215. The data exchange between the sense amplifier/write driver 211 and an external input/output terminal (also referred to as a data line) DQ (not shown) is performed through the data bus 220 and the DQ circuit 230.

The column fuse 212 is an electrically programmable nonvolatile storage such as an anti-fuse or an electric fuse, and stores column redundancy information on the memory cell array 210. The column fuse 212 supplies, for example, the column redundancy information to the array controller 215 and the sense amplifier/write driver 211. When the column fuse 212 supplies the column redundancy information to the array controller 215, the array controller 215 accesses the corresponding redundancy cell. The column redundancy information includes bit line pair information (i.e., information on a bit line and a source line), column information, etc. If a defective memory cell is found in a test before shipping in a method described below, the column redundancy information is stored in the column fuse 212.

The row decoder 213 is arranged to extend in the word line direction of the memory cell array 210 and is connected to the word lines of the memory cell array 210. The row decoder 213 decodes the address of the command address signal CAi supplied from the command/address circuit 250, and selects a word line based on a word line selection signal.

The row fuse 214 is an electrically programmable nonvolatile storage such as an anti-fuse or an electric fuse, and stores row redundancy information on the memory cell array 210. The row fuse 214 supplies the row redundancy information to the row decoder 213. When the row fuse 214 supplies the row redundancy information to the row decoder 213, the row decoder 213 accesses the corresponding redundancy cell. The row redundancy information includes word line information, row information, etc. If a defective memory cell is found in a test before shipping in a method described below, the row redundancy information is stored in the row fuse 214.

The column fuse 212 and the row fuse. 214 may be provided as a single fuse (storage area). If the column redundancy information and the row redundancy information need not be discriminated from each other, they will be referred to simply as redundancy information.

The array controller 215 functions as a column decoder and controls the bit lines BL and the source lines SL.

The DQ circuit 230 enables data to be exchanged between the memory controller 100 and the memory device 200 by way of an external input/output terminal DQ (also referred to as a data line), not shown.

The controller 240 receives various external control signals (such as a chip select signal CS, a clock signal CK, a clock enable signal CKE, etc.) supplied by way of the device interface 150 of the memory controller 100. The controller 240 controls the command address circuit 250 and discriminates addresses and commands from each other. The controller 240 performs the overall control of the memory device 200 and controls the access to the memory cell array 210 described later.

The commands address circuit 250 receives a command address signal CAi supplied thereto by way of the device interface 150 of the memory controller 100. The command address circuit 250 transfers the command address signal DCAi to the row decoder 213 and array controller 215.

The internal voltage generator 260 generates an internal voltage (e.g., a boosted voltage higher than a power supply voltage) required for each operation of the memory device 200. Controlled by the controller 240, the internal voltage generator 260 performs a voltage boost operation and generates a required voltage. Upon receipt of the fuse program voltage generating signal, the internal voltage generator 260 generates a voltage on which redundancy information can be written in the column fuse 212 and the row fuse 214.

<1-4> Memory Cell Array

A description will be given with reference to FIG. 2 of the configuration of the memory cell array according to the embodiment. As described above, the memory cell array 210 comprises a plurality of memory cells arranged in a two-dimensional matrix pattern. The word lines WL extending in the row direction and the bit lines BL extending in the column direction intersect each other. The adjacent two bit lines BL at form a pair, and a memory cell MC is provided at the intersection between word line WL and the bit line pair (in the present embodiment, the bit line pair will be referred to as bit line BL and source line SL for descriptive purposes). More specifically, the memory cell array 210 comprises a plurality of word lines WL0 to WLi-1, a plurality of bit lines BL0 to BLj-1 and a plurality of source lines SL0 to SLj-1. One of the rows of the memory cell array is connected to one word line WL, and one of the columns of the memory cell array is connected to one pair formed by one bit line BL and one Source line SL.

Each memory cell MC includes a magnetic tunnel junction (MTJ) element 20 and a selection transistor 21. The selection transistor 21 is formed of an N-channel MOsfet, for example.

One end of the MTJ element 20 is connected to bit line BL, and the other end thereof is connected to the drain of the selection transistor 21. The gate of the selection transistor 21 is connected to word line WL, and the source thereof is connected to source line SL.

The ordinary cell array 210a and the redundancy cell array 210b have substantially the same basic configuration as described above, although the differences between them were not mentioned.

<1-5> Memory Cell

A schematic description will be given with reference to FIG. 3 of the configuration of a memory cell according to the embodiment.

Figure 3:
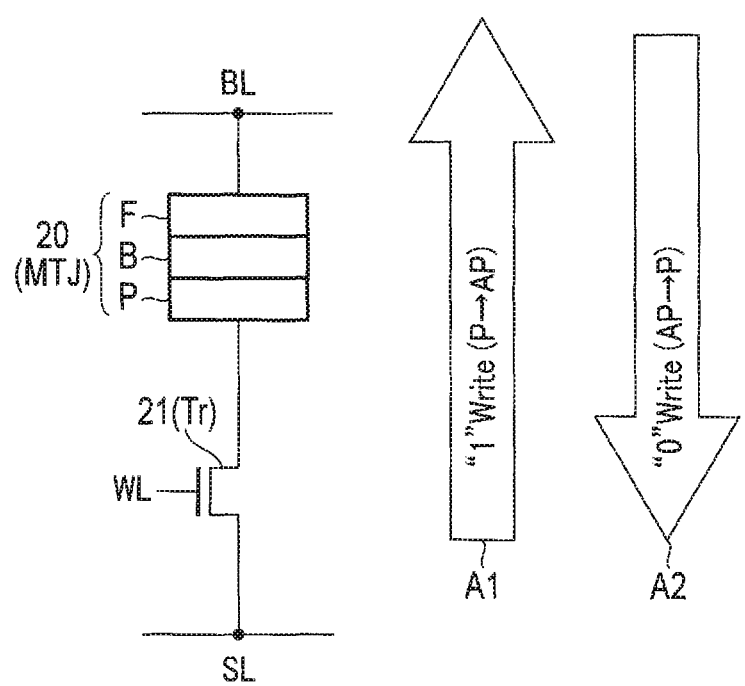
FIG. 3 illustrates a basic configuration of a memory cell of the memory system of the embodiment.

As shown in FIG. 3, one end of the MTJ element 20 of the memory cell MC of the embodiment is connected to bit line BL, and the other end of the MTJ element 20 is connected to one of the current path of the cell transistor 21, The other end of the cell transistor 21 is connected to source line SL. The MTJ element 20 utilizing the tunneling magnetoresistive (TMR) effect has a stack structure comprising two ferromagnetic layers F and P and one nonmagnetic layer (a tunnel insulation film) B sandwiched between the ferromagnetic layers F and P. The MTJ element stores digital data by utilization of variations in the magnetic resistance caused by a spin-polarized tunneling effect. The MTJ element 20 can be set in a low-resistance state or a high-resistance state in accordance with the magnetic orientations of the two ferromagnetic layers F and P. For example, if the low-resistance state is defined as data "0" and the high-resistance state is defined as data "1", 1-bit data can be recorded in the MTJ element 20. Needless to say, the low-resistance state may be defined as data "1" and the high-resistance state may be defined as data "0".

The MTJ element is formed, for example, by stacking a fixing layer (pin layer) P, a tunnel barrier layer B and a recording layer (free layer) F in the order mentioned. The pin layer P and the free layer F are made of a ferromagnetic material, and the tunnel barrier layer B is an insulating film (such as $Al_2O_3$ or MgO). The pin layer P is a layer in which the magnetic orientation is fixed, while the free layer F is a layer in which the magnetic orientation is variable and which stores data utilizing the magnetic orientation.

When a current flows in the direction of arrow A1 in a write operation, the magnetic orientation of the free layer F becomes anti parallel (AP state) with respect to the magnetic orientation of the pin layer P. As a result, a high-resistance state (data "1") is created. When a current flows in the direction of arrow A2 in a write operation, the magnetic orientation of the free layer F becomes parallel (P state) with respect to the magnetic orientation of the pin layer P. As a result, a low-resistance state (data "0") is created. As can be seen, different data can be written in the MTJ element by changing the direction of a current flow.

<2> Operation

<2-1> State Transition

A description will be given with reference to FIG. 4 of the state transition of the memory system according to the embodiment. In FIG. 4, thin arrows indicate how the state of the MRAM transitions when a command is received from the host 2. In FIG. 4, thick arrows indicate how the state of the MRAN transitions automatically, without any command received from the host 2, at the end of a predetermined operation.

[State 1] Power On

As shown in FIG. 4, when power is supplied to the memory system 1 from the host 2, the memory system 1 transitions to the power-on state (state 1).

[State 2] Resetting

When a resetting command is supplied to the memory system 1 from the host 2, the memory system 1 transitions to a resetting state (state 2). The host 2 can supply the resetting command to the memory system 1 when this memory system is either in the power-on state and or in the idle state.

[State 3] Idle

After the resetting processing, the scrub operation or the preactivating operation ends, the memory system 1 automatically transitions to the idle state (state 3). In the idle state, the memory system 1 is ready to start up (ON state).

[State 4] Scrubbing

When a scrub command is supplied to the memory system 1 from the host 2, the memory system 1 transitions to a scrubbing state (state 4). The host 2 can supply the scrub command to the memory system 1 when this memory system is in the idle state (state 3). The details of the scrubbing operation will be described later.

[State 5] Active

When an activate command is supplied to the memory system 1 from the host 2, the memory system 1 transitions to an active state (state 5). The host 2 can supply the activate command to the memory system 1 when this memory system is in the idle state (state 3). When the read/write operation or the mode register read/write operation ends, the memory system automatically transitions to the active state (state 5).

[State 6] Reading/Writing

When a reading/writing command (RD/WR) is supplied to the memory system 1from the host 2, the memory system 1 transitions to a reading/writing state (state 6). The host 2 can supply the reading/writing command to the memory system 1 when this memory system is either in the active state (state 5) and or in the reading/writing state (state 6).

[State 7] Mode Register Reading/Writing

When a mode register reading/writing command (MRR/MRW) is supplied to the memory system 1 from the host 2, the memory system 1 transitions to a mode register reading/writing state (state 7). The host. 2 can supply the mode register reading/writing command to the memory system 1 when this memory system is in the active state (state 5).

The "mode register reading" is reading data from the status register 130. The "mode register writing" is writing data in the status register 130. The status register 130 stores data representing the operating state etc. of the memory device 200. For example, the status register 130 stores data representing the kind of a burst, the length of the burst, the latency period, etc.

[State 8] Preactivating

When a preactive command is supplied to the memory system 1 from the host 2, the memory system 1 transitions to a preactivating state (state 8). The host 2 can supply the preactive command to the memory system 1 when this memory system is either in the active state (state 5) and or in the idle state (state 3).

The state transition diagram shown in FIG. 4 is an example, and the state transition may be performed in a different way. For example, a scrub command can be supplied to a system other than the DDRx system or LPDDRx system when that system is in the idle state, and a scrub operation can be performed in response thereto.

<2-2> Scrub Operation

Figure 5:
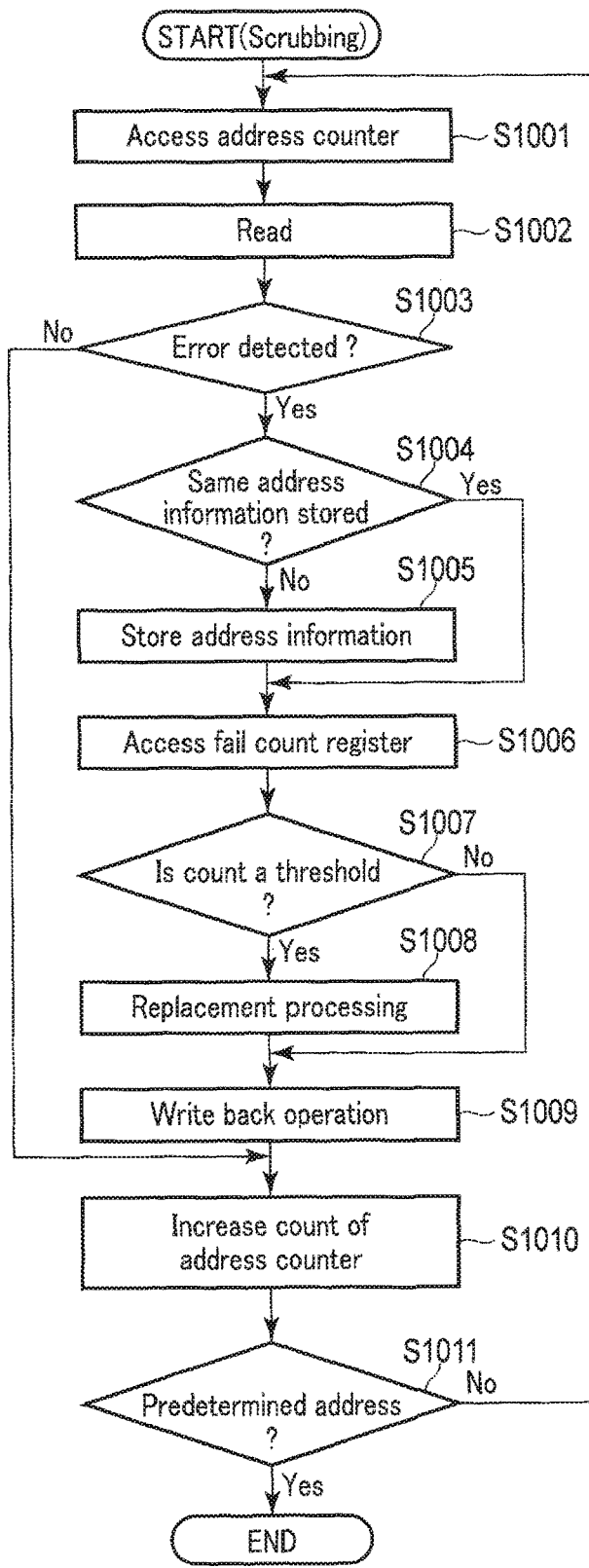
FIG. 5 is a flowchart illustrating a scrub operation of the memory system of the embodiment.

A description will be given with reference to FIG. 5 of the scrub operation of the memory system according to the embodiment.

The scrub operation is an operation the memory controller 100 performs when the user is riot performing the ordinary read/write operation. By the scrub operation, the memory cells MC of the ordinary cell array 210a are cyclically checked and a data error is corrected.

In the scrub operation, if the memory controller 100 detects an error occurring in the data stored in a predetermined memory cell MC, the memory controller 100 corrects the error and stores the correct data in the memory cell MC. As described in <1-5> set forth above, a current is supplied to the MTJ element 20 when data is written in the memory cell MC. Therefore, the MTJ elements 20 may deteriorate with time in accordance with an increase in the number of times a write operation is performed. For example, the memory cell MC which undergoes an error many times (which undergoes successful error correction by the same number of times) is very likely to be a cell that becomes defective with time. Even if correct data is written back into such a memory cell MC, it may not be properly written. Therefore, if the memory cell MC which undergoes an error more than a threshold (which undergoes successful error correction by the same number of times) is treated as a secondary defective cell. Such a memory cell MC should be desirably replaced with a redundancy cell MC. Thus, cells which become defective with time can be replaced with redundancy cells MC.

The scrub operation mentioned above will be described more specifically.

The host 2 can issue a scrub command to the memory system 1 when this memory system is in the idle state. Upon receipt of the scrub command from the host 2, the memory system 1 starts the scrub operation.

[Step S1001]

Upon receipt of the scrub command, the device interface 150 reads address n of the memory cell array 210 from the address counter 180.

[Step S1002]

The device interface 150 issues address n and a read command to the memory device 200. The memory device 200 reads data from the address n of the memory cell based on the received address n and the read command. Then, the memory device 200 supplies the read data d to the memory controller 100 through the data bus 220, DQ circuit 230 and data line DQ (not shown). As a result, the device interface 150 receives data d by way of the data line DQ.

[Step S1003]

The device interface 150 supplies data d to the ECC circuit 160, for error detection of data d. The ECC circuit 160 determines whether the received data d contains an error. If an error detected in data d, the ECC circuit 160 performs error correction for data d, using an error correcting code.

[Step S1004]

If it is determined that data d contains an error (YES in Step S1003), the ECC circuit 160 supplies an error notification signal "Error" to the fuse controller 170. The address comparator 170b receives address n from the address counter 180, if it receives error notification signal "Error" from the ECC circuit 160.

Subsequently, the address comparator 170b determines whether address n is stored in the fail address register 170a. In other words, the address comparator 170b determines whether the fail address register 170a stores the same address information as the address information (address n) corresponding to the error.

[Step S1005]

If the address comparator 170b determines that address n is not stored in the fail address register 170a (No in Step S1004), the address comparator 170b stores the information on address n corresponding to the error in the fail address register 170a.

[Step S1006]

If the address comparator 170b determines that address n is stored in the fail address register 170a (Yes in Step S1004), the fail count register 170c increases the count M corresponding to address n by one (count M: the number of times an error occurs or the number of times the error is successfully corrected).

If the fail address register 170a stores a new address n, the corresponding count. M is 1 (M=1).

[Step S1007]

The fail count register 170c determines whether count M corresponding to address n has reached threshold Mmax. This threshold Mmax can be determined in any desirable way. The threshold Mmax is stored, for example, in the fail count register 170c.

[Step S1008]

If the number of times an error occurs (the number of times the error is successfully corrected) has reached threshold Mmax, the memory cell MC corresponding to address n is regarded as having deteriorated with time and being incapable of storing accurate data. It is therefore desired that such a memory cell should not be used and a memory cell MC of the redundancy cell array 210b should be used instead. A more specific description will be given on this point.

If the fail count register 170c determines that count M corresponding to address n has reached threshold Mmax (YES in Step S1007), the fail count register 170c supplies signal "Err_max" to the fuse address generator 170d and the fuse program voltage generator 170e.

Upon receipt of signal "Err_max", the fuse address generator 170d generates fuse addresses designating the column fuse 212 and the row fuse 214, based on address n. The fuse address generator 170d supplies the generated fuse addresses (redundancy address information) to the memory device 200 by way of the device interface 150.

Upon receipt of signal "Err_max", the fuse program voltage generator 170e generates a signal that causes the internal voltage generator to generate to voltage used for a fuse program (namely, a fuse program voltage generating signal). The fuse program voltage generator 170e supplies the generated fuse program voltage generating signal to the memory device 200 by way of the device interface 150.

Upon receipt of the fuse address and the fuse program voltage generating signal, the controller 24 of the memory device 200 executes a fuse program for the column fuse 212 and the row fuse 214. As a result, redundancy information is written in the column fuse 212 and the row fuse 214, thereby enabling access to the memory cell MC of the redundancy cell array 210b, not to the memory cell MC of the ordinary cell array, when address n should be accessed.

As a result, the memory cell MC of the ordinary cell array is treated as a memory cell MC which should not be used, like an inherently defective cell. Replacing address n with redundancy cell array 210b as above may be referred to as replacement processing.

As described above, the memory system 1 of the embodiment enables remedying secondary defective cells which become defective with time.

[Step S1009]

After the end of the fuse program in Step S1008 or if the fail register 170c determines that count M of address n has not reached threshold Mmax (No in Step S1007), the ECC circuit 160 transmits error-corrected data de to the device interface 150. The device interface 150 supplies the error-corrected data de, address n and a write command to the memory device 200.

Upon receipt of the write command and address n, the controller 240 writes data de received through the DQ circuit 230 back into the memory cell array 210. As a result, error-corrected accurate data is written in the memory cell array 210.

If replacing processing is executed for address n, the related data is written in the memory cell MC of the redundancy cell array 210b.

[Step S1010]

If it is determined that data d does not contain an error (No in Step S1003), the ECC circuit 160 supplies a notification signal "No_Error" to the host 2.

After notification signal "No_Error" is transmitted to the host 2 or after the write back operation in Step S1009 ends, the device interface 150 increases the count of the address counter 180 by one (address n=n+1). As a result, the device interface 150 can access the next address of address n.

[Step S1011]

The device interface 150 determines whether address n stored in the address counter 180 is the predetermined one. If the device interface 150 determines that address n stored in the address counter 180 is predetermined address nmax, the scrub operation is ended (YES in Step S1011). After the scrub operation is ended, the memory system 1 automatically transitions to the idle state. If the CPU 140 determines that address n stored in the address counter 180 is not predetermined address nmax (NO in Step S1011), the flow returns to Step S1001.

The address nmax can be determined in any desirable way. To determine address nmax is to define the number of addresses that starts the error detection in the scrub operation. The larger the number of addresses is, the longer the time required for the scrub operation becomes. Where the time required for the scrub operation is variable, address nmax may be properly changed.

In connection with the above-mentioned embodiment, reference was made to the case where the scrub operation is continued until address n becomes equal to predetermined address nmax. However, this does not impose any limitation.

For example, the scrub operation may be interrupted in response to a request made by the user.

In addition, the scrub operation may be performed for a single address by entering a scrub command only once, instead of performing error detection for a plurality of addresses in the scrub operation.

<2-3> Specific Example of Operation that Does not Cause Error

A description will be given with reference to FIG. 6 of a specific example of an operation which the memory system of the embodiment performs when an error is not generated.

[Time T0]

At time T0, the memory system 1 starts the scrub operation upon receipt of a scrub command from the host 2 (corresponding to Step S1001).

[Time T1]

At time T1, data is read and supplied from the memory device 200 to the memory controller 100 by way of the DQ line (not shown) (corresponding to Step S1002).

[Time T2]

At time T2, data is supplied to the FCC circuit 160, and the FCC circuit 160 starts an error detection operation (corresponding to Step S1003).

[Time T3]

If the ECC circuit 160 determines that the data contains no error, it notifies the host 2 at time T3 that there is no error (No_Error) (corresponding to Step S1003).

[Time T4]

At time 4, the device interface 150 increases the address of the address counter 180 by one to determine the address for which error detection is performed next (corresponding to Steps S1010 and S1011). Then, the device interface 150 determines whether address n stored in the address counter 180 is the predetermined one.

[Time T5]

If the scrub operation is to be performed for a single address by entering a scrub command only once, the host 2 becomes ready to receive a scrub command at time T5.

In this case, the period between the time when the scrub command is input and the time when the next scrub command can be input is defined as tSCRI1. In other words, the host 2 can issue the next scrub command to the memory system 1 when period tSCRI1 elapses after the host issues the first scrub command.

[Time T6 to Time T8]

After the host 2 receives a scrub command at time T5 or if the address of the address counter 180 is increased by one at time T4 and determination is made that the predetermined address has not yet been reached, the memory system 1 performs operations similar to those executed at times T1 to T3.

<2-4> Specific Example of Operation that Causes Error

A description will be given with reference to FIG. 7 of a specific example of an operation performed when an error is generated.

[Time T10 to Time T12]

The memory system 1 performs similar operations to those executed at times T0 to T2.

[Time T13]

Upon detection of an error in data, the ECC circuit 160 transmits error notification signal "Error" indicative of an error to the fuse controller 170 (corresponding to Step S1003). The memory system 1 performs similar operations to those executed in Steps S1004 to S1007 described above.

[Time T14]

If the number of times an error occurred in the past (the number of times the error was successfully corrected) with respect to the address for which an error currently occurs is smaller than a threshold, the memory system 1 writes data whose error is corrected by the ECC circuit 160 in the memory cell array 210 at time T14 (corresponding to Step S1009).

[Time T15 to Time T18]

The memory system 1 performs similar operations to those executed at times T4 to T7.

The time tSCRI2 required in the case where an error occurs and replacement is not performed is longer than the time tSCRI1 required in the case where an error does not occur. This is because error-corrected data has to be written in the case where an error occurs and replacement is not performed.

[Time T19]

The memory system 1 performs a similar operation to that executed at time T13.

[Time T20]

If it is determined that the number of times an error occurred in the past (the number of times the error was successfully corrected) with respect to the address for which an error currently occurs has reached a predetermined number of times, the fuse control circuit 170 issues signal "Err_max" (corresponding to step S1007).

[Time T21]

At time T21, a fuse program address is issued based on signal "Err_max" and the address where the error has occurred (corresponding to Step S1008).

[Time T22]

At time T22, a fuse program voltage generating signal is generated based on signal "Err_max" (corresponding to Step S1008).

[Time T23]

At time T23, a fuse program operation is performed in the memory device 200 (corresponding to Step S1008).

[Time T24]

The memory system 1 stands by until the end of the fuse program operation and then performs a similar operation to that executed at time T14.

[Time T25 and Time T26]

The memory system 1 performs similar operations to those executed at times T4 and T5.

The time tSCRI3 required in the case where an error occurs and replacement is performed is longer than the time tSCRI2 required in the case where an error occurs and replacement is not performed. This is because the fuse program operation has to be performed in the case where an error occurs and replacement is performed.

<3> Advantages

According to the embodiment described above, the memory system performs a scrub operation if the user does not request an ordinary read/write operation. In the scrub operation, the memory system performs an error check with respect to the memory cells MC of the memory cell array. If an error is detected in data, the address information corresponding to the error and the number of times an error occurred in the past at the same address are stored in the memory controller. If the number of times an error occurs in the past reaches a setting value determined by the user, the memory cell in question is replaced with the redundancy cell array.

As described above, the MRAN may deteriorate with time and become incapable of storing accurate data. Continuous use of such a memory cell MC is not desirable in terms of the reliability of the memory system.

According to the embodiment described above, the memory system records the address where an error occurs and the number of times the error occurs (the number of times the error is successfully corrected) at the same address. By virtue of this, the memory system 1 can detect a memory cell that becomes incapable of storing accurate data due to the characteristic deterioration with time. The memory system 1 replaces the memory cell incapable of storing accurate data with a redundancy cell. Accordingly, the memory system of the present embodiment is very reliable in operation.

According to the present embodiment, a defective cell can be dynamically replaced with a redundancy cell even after shipping. In other words, the memory cell array 210 having a potentially defective cell (i.e., a cell having poor quality) can be properly remedied. For this reason, the memory system need not be subjected to strict screening before it is shipped. As a result, the stress imposed on the memory system at the time of screening can be reduced. Accordingly, the memory system does not deteriorate before it is used actually, and a memory system that ensures a reliable operation is realized.

(Modifications)

The above embodiment was described referring to the case where the storage is an MRAM. However, the storage may be realized as another type of resistance change memory having similar structural elements to those described above, such as a phase change random access memory (PCRAM) or a resistive random access memory (ReRAM). In addition, the memory system 1 described above may be applicable to a DRAM instead of an MRAM.

In connection with the above embodiment, the bit line pair was described as having bit line BL and source line SL for descriptive purposes. However, the bit line pair may be made up of a first bit line and a second bit line.

In the memory system of the above embodiment, the column fuse 212 and the row fuse 214 are used to access a redundancy cell, but this structure is merely an example. For example, one of the column fuse 212 and the row fuse 214 is sufficient to access the redundancy cell, and an operation similar to that described above can be performed in this case as well.

In the embodiment described above, the memory system 1 is designed to connect one memory device 200 to the memory controller 100. However, this is merely an example. For example, the memory system 1 may be designed to connect a plurality of memory devices 200 to the memory controller 100.

While certain embodiments have been described, these embodiments have been presented by way of example only, and are not intended to limit the scope of the claims. Indeed, the novel methods and systems described herein may be embodied in a variety of other forms; furthermore, various omissions, substitutions and changes in the form of the methods and systems described herein may be made without departing from the spirit of the embodiments. The accompanying claims and their equivalents are intended to cover such forms or modifications as would fall within the scope and spirit of the embodiments.

What is claimed is:

1. A memory system comprising:
 a first memory cell area where a first memory cell is provided;
 a second memory cell area where a second memory cell is provided;
 an ECC circuit which corrects an error of data stored by the first memory cell; and
 a control circuit which replaces the first memory cell with the second memory cell if a number of times an error is corrected in the first memory cell reaches a first value.

2. The memory system of claim 1, wherein
 the first memory cell assigned with an address, and
 the control circuit stores the address where an error is successfully corrected by the ECC circuit.

3. The memory system of claim 2, wherein
 the control circuit stores a number of times the error is successfully corrected at the address, and determines whether the number of times the error is corrected in the first memory cell reaches the first value.

4. The memory system of claim 3, further comprising
 a third memory area that stores first information used for replacing the first memory cell with the second memory cell.

5. The memory system of claim 4, wherein the control circuit generates an address of the third memory area to replace the first memory cell with the second memory cell, and further generates a voltage at which data is written in the third memory area.

6. The memory system of claim 2, further comprising an address counter that counts an address each time the first memory cell area is accessed,
 wherein the ECC circuit performs an error check with respect to the first memory area until the address stored in the address counter reaches a first address.

7. The memory system of claim 2, wherein the control circuit determines whether an address where an error occurs is identical to an address stored in the control circuit, and stores an address where the error occurs if the address is identical to the address stored in the control circuit.

8. The memory system of claim 1, wherein the control circuit writes a corrected data in the address where the error occurs if a number of times the error is successfully corrected in the first memory cell has not reached the first value, and writes the corrected data in the second memory cell if the number of times the error is successfully corrected in the first memory cell has reached the first value.

9. The memory system of claim 4, wherein the third memory area is a nonvolatile area.

10. The memory system of claim 4, wherein the third memory area is formed by a metal or a semiconductor.

11. The memory system of claim 4, wherein the second memory area is a redundancy area and is accessible in accordance with the first information.

12. The memory system of claim 1, wherein the first memory cell and the second memory cell include a resistance change element capable of storing data.

13. The memory system of claim 1, wherein the first memory area and the second memory area are made of one of a magnetoresistive random access memory (MRAM), a ferroelectric random access memory (FeRaM), a phase change random access memory (PCRAM) or a resistive random access memory (ReRaM).

14. The memory system of claim 1, wherein the first memory area and the second memory area are DRAMs.

15. A memory system comprising:
a first memory cell area where a first memory cell is provided;
a second memory cell area where a second memory cell is provided;
an ECC circuit which detects an error of data stored by the first memory cell; and
a control circuit which replaces the first memory cell with the second memory cell if a number of times an error occurs in the first memory cell reaches a first value.

16. The memory system of claim 15, wherein the first memory cell is assigned with an address, and the control circuit stores data on an address where occurrence of an error is determined by the ECC circuit.

17. The memory system of claim 16, wherein the control circuit stores data on a number of times the error occurs at the address, and determines whether the number of times the error occurs in the first memory cell reaches the first value.

18. The memory system of claim 17, further comprising a third memory area that stores first information used for replacing the first memory cell with the second memory cell.

19. The memory system of claim 15, wherein the first memory cell and the second memory cell include a resistance change element capable of storing data.

20. The memory system of claim 15, wherein the first memory area and the second memory area are DRAMs.

* * * * *